(12) United States Patent
Ito et al.

(10) Patent No.: US 9,606,205 B1
(45) Date of Patent: Mar. 28, 2017

(54) MAGNETIC RESONANCE IMAGING APPARATUS, RF SHIMMING METHOD, AND MAGNETIC RESONANCE IMAGING METHOD

(71) Applicant: HITACHI, LTD., Tokyo (JP)

(72) Inventors: Kosuke Ito, Tokyo (JP); Masahiro Takizawa, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 14/993,393

(22) Filed: Jan. 12, 2016

(30) Foreign Application Priority Data

Jan. 4, 2016 (JP) ................................. 2016-000048

(51) Int. Cl.
G01R 33/3875 (2006.01)
G01R 33/563 (2006.01)
G01R 33/561 (2006.01)

(52) U.S. Cl.
CPC ..... G01R 33/3875 (2013.01); G01R 33/5617 (2013.01); G01R 33/56308 (2013.01)

(58) Field of Classification Search
CPC ............ G01R 33/3875; G01R 33/5617; G01R 33/56308
See application file for complete search history.

(56) References Cited

U.S. PATENT DOCUMENTS

| | | | | |
|---|---|---|---|---|
| 4,859,949 A | * | 8/1989 | McKenna | G01R 33/307 324/318 |
| 4,987,371 A | * | 1/1991 | Glover | G01R 33/3875 324/307 |
| 6,064,208 A | * | 5/2000 | Steckner | G01R 33/3875 324/300 |
| 7,439,742 B2 | * | 10/2008 | Fontius | G01R 33/3415 324/318 |
| 7,800,368 B2 | * | 9/2010 | Vaughan | G01R 33/583 324/318 |

(Continued)

FOREIGN PATENT DOCUMENTS

| | | |
|---|---|---|
| JP | 2004-41729 | 2/2004 |
| JP | 2004-530518 | 10/2004 |

(Continued)

OTHER PUBLICATIONS

English translation of Japanese official action dated Feb. 23, 2016 in corresponding Japanese patent application No. 2016-000048.

(Continued)

Primary Examiner — Dixomara Vargas
(74) Attorney, Agent, or Firm — Cooper & Dunham LLP

(57) ABSTRACT

An imaging unit of an MRI apparatus collects NMR signals using high frequency pulses including a pre-RF pulse exciting a first region and an excitation RF pulse exciting a second region different from the first region. A shimming parameter calculation unit calculating a shimming parameter for adjusting a radiation magnetic field distribution generated by the high-frequency pulses radiated from a plurality of channels sets different shimming parameters in the pre-RF pulse and the excitation RF pulse. The imaging unit performs imaging using the pre-RF pulse and the excitation RF pulse adjusted with the different shimming parameters.

13 Claims, 14 Drawing Sheets

(56) References Cited

U.S. PATENT DOCUMENTS

| | | | |
|---|---|---|---|
| 2011/0128000 A1 | 6/2011 | Harvey | |
| 2014/0327440 A1* | 11/2014 | Nakanishi | A61B 5/055 |
| | | | 324/309 |
| 2015/0042335 A1* | 2/2015 | Nehrke | G01R 33/5659 |
| | | | 324/309 |
| 2015/0346309 A1* | 12/2015 | Campagna | G01R 33/583 |
| | | | 324/307 |

FOREIGN PATENT DOCUMENTS

| | | |
|---|---|---|
| JP | 2008-142479 | 6/2008 |
| WO | WO 2012/043198 A1 | 4/2012 |
| WO | WO 2014/021172 A1 | 2/2014 |

OTHER PUBLICATIONS

English translation of Decision to Grant a Patent dated Apr. 26, 2016 in corresponding Japanese patent application No. 2016-000048.
Nishihara et al., 'Selective TOF MRA using Beam Saturation pulse,' Proc. Intl. Soc. Mag. Reson. Med., 2012.
Davies et al., 'Selective Arterial Spin Labeling (SASL): Perfusion Territory Mapping of Selected Feeding Arteries Tagged Using Two-Dimensional Radiofrequency Pulses,' Magnetic Resonance in Medicine, vol. 49, No. 6, p. 1133-1142, 2003.

\* cited by examiner

FIG.8
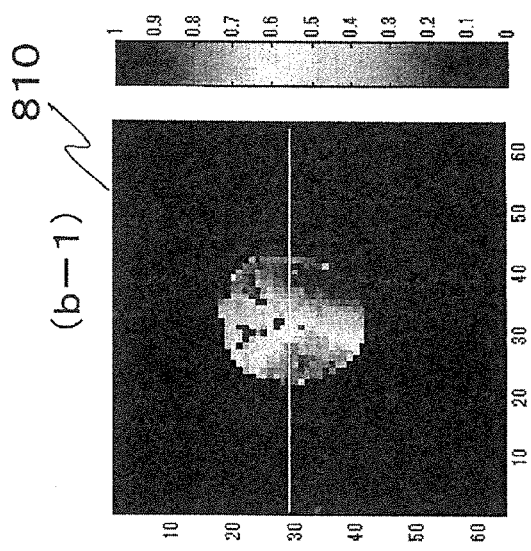
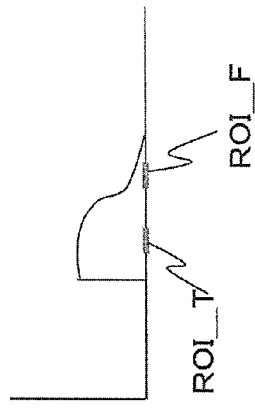
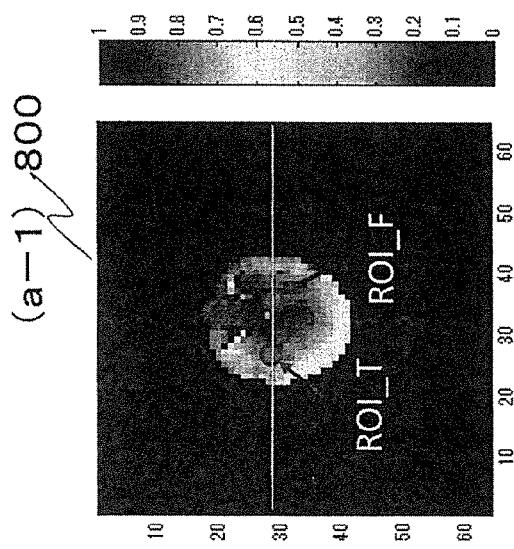
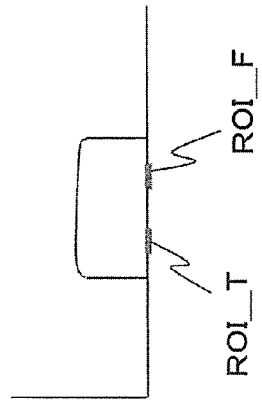

FIG.12

| | LEFT CAROTID ARTERY | RIGHT CAROTID ARTERY | VERTEBRAL ARTERY | IMAGES |
|---|---|---|---|---|
| FIRST IMAGING | ○ | X | X | LEFT CAROTID ARTERY |
| SECOND IMAGING | X | ○ | X | RIGHT CAROTID ARTERY |
| THIRD IMAGING | ○ | ○ | ○ | VERTEBRAL ARTERY |

X: SUPPRESSED
○: NOT SUPPRESSED

MAGNETIC RESONANCE IMAGING APPARATUS, RF SHIMMING METHOD, AND MAGNETIC RESONANCE IMAGING METHOD

FIELD OF THE INVENTION

The present invention relates to a magnetic resonance imaging apparatus (hereinafter referred to as an MRI apparatus), and particularly, to an imaging technology using a suppression pulse suppressing a predetermined signal.

BACKGROUND ART

An MRI apparatus is an apparatus that measures NMR signals from nuclei, mainly protons, present in a biological object and images a nuclear density (proton density) or phase information of NMR signals in a biological tissue. In MRI apparatuses, various blood flow imaging methods using differences in behaviors between blood flow protons and stationary tissues have been developed, and technologies for drawing desired blood flows with higher luminance than other blood flows using differences in the directions of the blood flows have widely been used. For example, there are technologies for preliminarily exciting upstream or downstream blood flow protons and suppressing signals of blood flows entering imaged regions, and separating arteries from veins.

In such technologies, RF pulses saturating protons of unnecessary blood flows in advance and weakening signals (referred to as pre-saturation pulses) are used to suppress signals from the unnecessary blood flows. In the methods, arteries can be separated from veins, but any desired arteries or veins may not selectively be drawn among a plurality of arteries or veins. In contrast, a method (2D excitation method) of exciting only a desired part has been developed by combining RF pulses and region-selection gradient magnetic fields.

On the other hand, in current MRI apparatuses, RF pulses are radiated using multi-channel transmission coils in which a plurality of small coils are combined. In this case, for an excitation RF pulse, there is a request for desiring a magnetic field radiated to an excited region (radiated magnetic field) to be spatially uniform. This is because when a distribution is present in an excited magnetic field, irregularity occurs due to the distribution in an NMR signal from a tissue, and thus an accurate proton distribution or phase information may not be obtained. For this reason, in MRI apparatuses of the traditional way, a magnetic field distribution generated by an RF pulse radiated in advance from each channel is measured, a correction amount for uniformizing the magnetic field distribution is calculated, and this correction amount is superimposed on a driving voltage of an RF coil generating an RF pulse (see JP-A-2010-29640). This correction amount is referred to as an RF shimming parameter.

CITATION LIST

Patent Literature

[PTL 1]
International Publication No. 2011/037064 description
[PTL 2]
Unexamined Patent Publication No. 2010-29640

SUMMARY OF THE INVENTION

When only desired arteries in blood flows from a plurality of arteries are drawn, an RF pulse with a special shape (envelope) and a gradient magnetic field pulse are combined and applied so that only a restricted region is excited and pre-saturated in the above-described 2D excitation method. Therefore, RF shimming can be omitted. However, since the RF pulse and the gradient magnetic field pulse are combined for excitation, there is a problem that a pulse application time necessary for pre-saturation is long.

The invention enables one of two tissues or parts to be drawn with higher luminance than the other tissue or part without extension of a pulse application time by adjusting a pre-RF pulse and an excitation RF pulse with different shimming parameters having different effects on a predetermined tissue or part in imaging performed using these RF pulses. For example, the shimming parameter is adjusted in a region excited with the pre-RF pulse so that the pre-RF pulse has a radiation magnetic field distribution in which a radiation magnetic field is smaller in one part among a plurality of parts than in the other parts. The shimming parameter is adjusted so that the excitation RF pulse has a radiation magnetic field distribution which is uniform in an entire excited region.

The invention is appropriately applied to blood flow imaging.

BRIEF DESCRIPTION OF THE DRAWINGS

FIGS. 8(a) and 8(b) are diagrams illustrating an initial radiation magnetic field distribution and a radiation magnetic field distribution adjusted by a shimming parameter according to the first embodiment.

FIG. 12 is a diagram illustrating a relation between imaging performed by an MRI apparatus and an image obtained through the imaging according to the second embodiment.

DETAILED DESCRIPTION OF THE INVENTION

An overview of an embodiment of the present invention will be described.

An MRI apparatus according to an embodiment of the invention includes: an imaging unit configured to include a transmission coil of a plurality of channels radiating high frequency pulses from the plurality of channels and collect NMR signals using the high frequency pulses which include a pre-RF pulse exciting a first region of an object and an excitation RF pulse exciting a second region different from the first region; and a shimming parameter calculation unit configured to calculate shimming parameters for adjusting radiation magnetic field distributions generated by the high frequency pulses radiated from the plurality of channels. The shimming parameter calculation unit calculates, as the shimming parameter for the pre-RF pulse, a first shimming parameter different from a second shimming parameter which is a shimming parameter set for the excitation RF pulse. The imaging unit performs imaging using the pre-RF pulse adjusted with the first shimming parameter and the excitation RF pulse adjusted with the second shimming parameter.

For example, the shimming parameter calculation unit calculates the first shimming parameter so that the radiation magnetic field distribution generated in the first region by the pre-RF pulse is smaller in a radiation magnetic field of a first part than in a radiation magnetic field of a second part. The fact that the radiation magnetic field (B1) is large/small means that the intensity (|B1| is large/small.

The MRI apparatus according to the embodiment can set a shimming parameter in which a radiation magnetic field distribution generated by the pre-RF pulse is small in a desired part (first part), compared to setting of the shimming parameter so that the radiation magnetic field distribution is uniform in a part imaged by RF shimming of the traditional way, and can selectively draw a desired part in an imaged part selectively excited subsequently by an excitation RF pulse. Alternatively, a part other than the desired part can be selectively drawn in the imaged part selectively excited by a subsequent excitation pulse.

Figure 1:
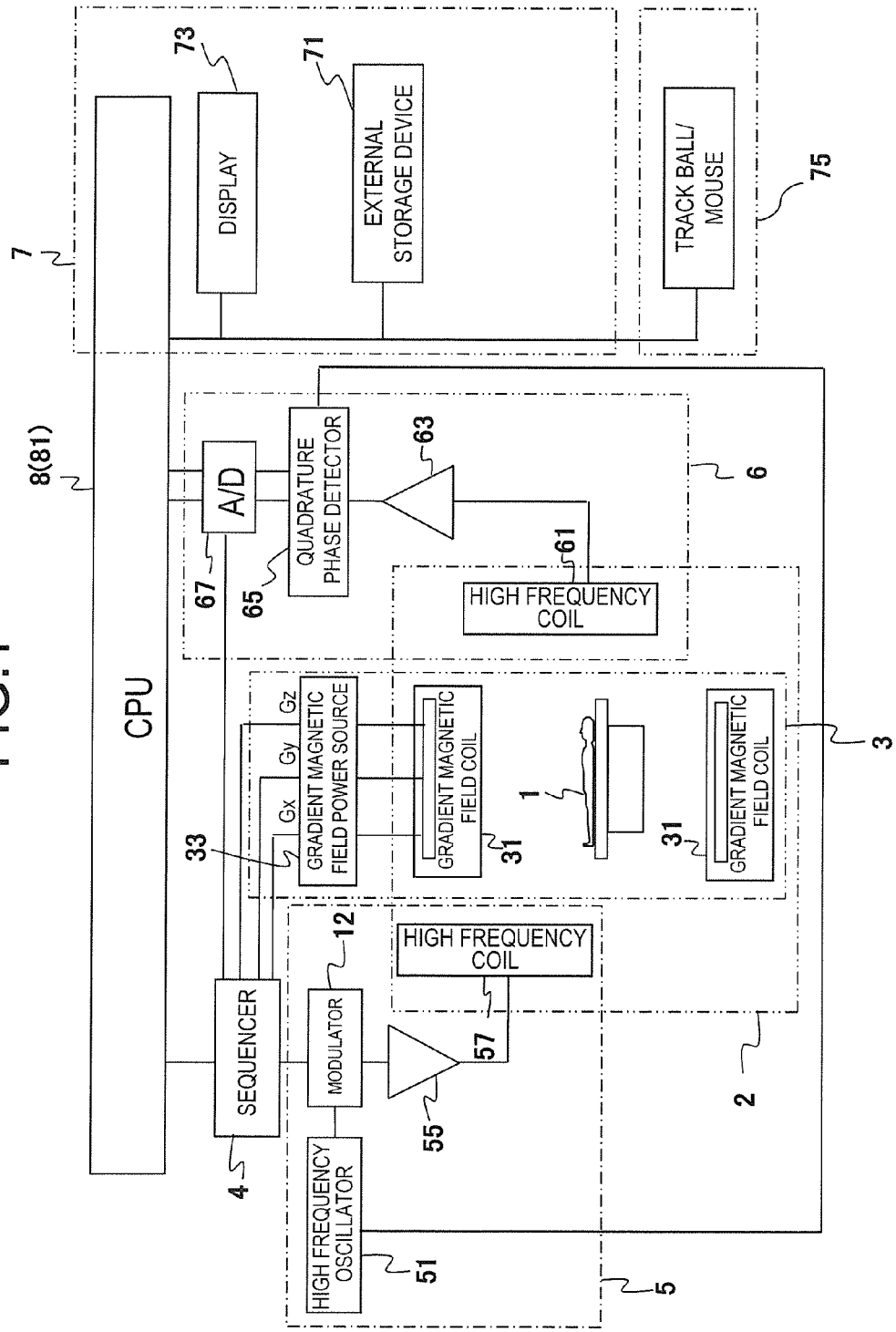
FIG. 1 is a diagram illustrating an embodiment of an MRI apparatus to which the invention is applied.

Next, the entire configuration of the MRI apparatus to which the embodiment is applied will be described. FIG. 1 is a block diagram illustrating the entire configuration of the MRI apparatus according to the embodiment. As illustrated in the drawing, an MRI apparatus 100 according to the embodiment includes a static magnetic field generation unit 2, a gradient magnetic field generation unit 3, a sequencer 4, a transmission unit 5, a reception unit 6, a signal processing unit 7, a calculation unit 8, and a bed 9 on which an object 1 is loaded.

The static magnetic field generation unit 2 is a device that generates a uniform static magnetic field in a space in which the object 1 is placed and includes a static magnetic field generation device of a permanent magnet scheme, a normal conduction scheme, or a superconduction scheme. There are a vertical magnetic field scheme and a horizontal magnetic field scheme according to a direction of a static magnetic field. The shape of a magnet included in the static magnetic field generation device or a gantry shape surrounding the magnet differs according to a difference in the scheme. The invention can be applied without being limited to a static magnetic field generation device of any scheme.

The gradient magnetic field generation unit 3 forms a magnetic field gradient in a static magnetic field space formed by the static magnetic field generation unit 2 and includes three groups of gradient magnetic field coils 31 generating a gradient magnetic field of triaxial directions of X, Y, and Z which are a coordinate system of the MRI apparatus, that is, a static coordinate system, and gradient magnetic field power sources 33 driving the gradient magnetic field coils 31. Gradient magnetic fields Gx, Gy, and Gz are applied in the triaxial directions of X, Y, and Z by driving the gradient magnetic field power sources 33 according to a command from the sequencer 4 to be described below. Accordingly, positional information can be granted to an NMR signal (echo signal) generated from the object 1 in response to radiation of a high frequency pulse. Specifically, an imaged cross section (slice plane) in any direction can be set by combining the three groups of gradient magnetic field coils and an echo signal can be subjected to phase encoding or frequency encoding in two directions orthogonal to the slice plane and mutually orthogonal to each other.

The transmission unit 5 radiates a high frequency pulse to the object 1 to generate nuclear magnetic resonance to nuclear spins of atoms that form a biological tissue of the object 1, and therefore includes a high frequency oscillator 51, a modulator 53, a high frequency amplifier 55, and a high frequency coil (hereinafter referred to as a transmission coil) 57. A species of an atomic nucleus to be imaged with a general MRI apparatus is a hydrogen nucleus (proton) which is a main constituent substance of an object.

A high frequency pulse (hereinafter referred to as an RF pulse) that has a predetermined amplitude and a predetermined phase is radiated to the object 1 by causing the modulator 53 to perform amplitude modulation on the RF pulse output from the high frequency oscillator 51 at a timing by an instruction from the sequencer 4, causing the high frequency amplifier 55 to amplify the high frequency pulse subjected to the amplitude modulation, and subsequently supplying the high frequency pulse to the transmission coil 57. The amplitude or the phase of the RF pulse can be adjusted by the modulator 53 and the high frequency amplifier 55.

As the transmission coil 57, any of various types of high frequency coils can be used according to the vertical magnetic field scheme or the horizontal magnetic field scheme of the static magnetic field generation unit 2 or a whole body or local use. The embodiment is not limited to the type of transmission coil 57, but a transmission coil of a plurality of channels having a plurality of feeding points is used. In the present specification, "the transmission coil of the plurality of channels" includes a multiple-coil in which a plurality of small coils are combined, a birdcage coil, and a transmission coil having a plurality of feeding points, such as a Transverse Electromagnetic (TEM) coil.

Figure 2:
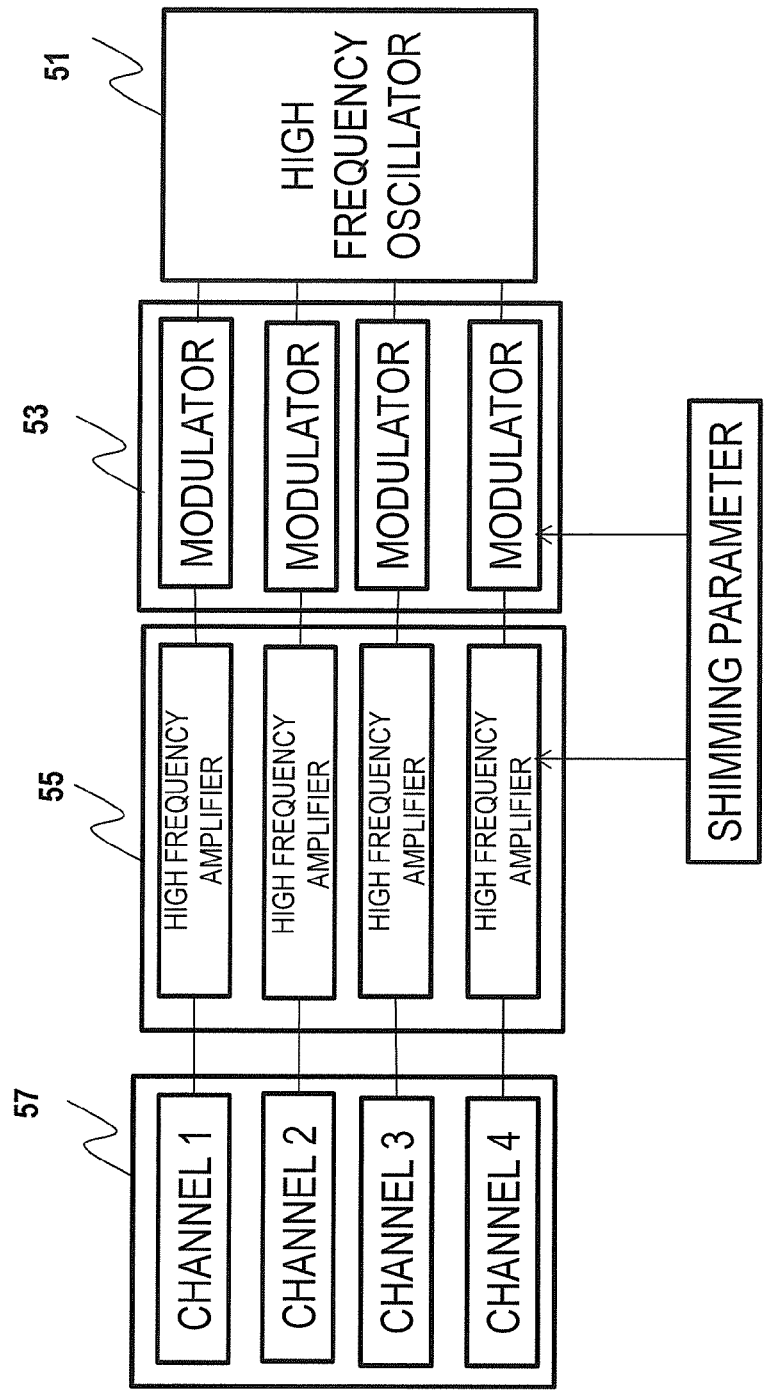
FIG. 2 is a diagram illustrating an embodiment of a transmission coil adopted in the invention.

In the transmission coil 57 of the plurality of channels, as illustrated in FIG. 2, the channels are connected to the transmission unit 5 and are driven for each channel. In FIG. 2, the transmission coil of 4 channels is exemplified, but the number of channels is not particularly limited as long as the number of channels is equal to or greater than 3. A magnetic field generated by a high frequency pulse radiated from the transmission coil 57 of the plurality of channels (hereinafter referred to as a radiation magnetic field) is formed in such a manner that radiation magnetic fields of the channels are combined. A radiation magnetic field distribution is decided by the combination. In general, it is desirable that the radiation magnetic field be spatially uniform, and the amplitude and the phase of the RF pulse radiated from each channel are adjusted so that the radiation magnetic field distribution is spatially uniform. Adjusting the amplitude and the phase of the RF pulse is referred to as RF shimming. The amplitude and the phase of each RF pulse deciding the radiation magnetic field distribution are referred to as RF shimming parameters. Since magnetization intrinsic in an object also has an influence on the radiation magnetic field distribution, it is necessary to perform the RF shimming on each object (an imaged part of an object). The details of the RF shimming performed by the MRI apparatus according to the embodiment will be described below.

The reception unit 6 detects an echo signal emitted by the nuclear magnetic resonance to nuclear spins of atoms that form a biological tissue of the object 1, and therefore includes a reception side high frequency coil (hereinafter referred to as a reception coil) 61, a signal amplifier 63, a quadrature phase detector 65, and an A/D converter 67. The echo signal detected by the reception coil 61 is amplified by the signal amplifier 63 and is subsequently divided into two quadrature system signals by the quadrature phase detector 65 at a timing instructed from the sequencer 4. Then, the signals are each converted with a digital amount by the A/D converter 67 and are transmitted to the signal processing unit 7.

The imaging unit of the MRI apparatus according to the embodiment is configured to include the static magnetic field generation unit 2, the gradient magnetic field generation unit 3, the sequencer 4, the transmission unit 5, and the reception unit 6 described above.

The signal processing unit 7 displays and stores various kinds of data processing and processing results, and therefore can include a CPU 81 which also serves as the calculation unit 8 and further include an external storage device 71 such as an optical disc or a magnetic disk, a display unit (display) 73 that displays an image, a GUI, or the like, and an input unit 75. The input unit 75 inputs various kinds of control information of the MRI apparatus or control information of processes performed by the signal processing unit 7 and therefore includes an input device such as a track ball, a keyboard, or a mouse and configures a user interface with the display 73 displaying a GUI. That is, an operator interactively controls various processes of the MRI apparatus via the input unit 75 while viewing a display screen of the display 73 disposed near the input unit 75.

When data (echo signal) is input from the reception unit 6 to the CPU 81, the CPU 81 performs processes such as signal processing and image reconstruction, displays an image of the object 1 as the processing result on the display 73, and records the image on the external storage device 71. The image of the object 1 includes a morphological image or a functional image formed as an image of a spatial distribution of proton density or a spatial distribution of a relaxation time of an excitation state.

The calculation unit 8 transmits instructions to the transmission unit 5 and the reception unit 6 via the sequencer 4 to perform control such that imaging is performed according to a predetermined pulse sequence. According to the pulse sequence, application intensities or timings of the high frequency pulse and the gradient magnetic field pulse, echo signal collection timings, and the like are decided. There are various pulse sequences according to imaging methods. The pulse sequence is stored as a program in an internal storage device or the external storage device. The calculation unit 8 controls imaging according to the pulse sequence by reading and executing a desired pulse sequence.

The calculation unit 8 has a function of calculating the shimming parameters for deciding the radiation magnetic field of the high frequency pulse included in the pulse sequence in addition to the control of the imaging described above. As described above, the transmission coil 57 according to the embodiment is a transmission coil of multiple channels. The calculation unit 8 calculates the shimming parameters for each channel of the transmission coil to optimize the radiation magnetic field. The optimization does not include only uniformization such as an MRI apparatus of the traditional way.

The shimming parameter calculation unit according to the embodiment means a portion that realizes a function of calculating the above-described shimming parameters in the calculation unit 8. The calculation unit 8 is mainly configured to include the CPU 81, software associated with the CPU 81, and a memory. However, all or some of the functions of the calculation unit including the shimming parameter calculation unit can be realized by, for example, hardware other than the CPU 81, such as an Application Specific Integrated Circuit (ASIC) or a Field Programmable Gate Array (FPGA), which is included in the invention.

The MRI apparatus according to the embodiment causes the shimming parameter of the pre-RF pulse to be different from the shimming parameter of the excitation RF pulse which is used to excite an imaged part and is applied separately from the pre-RF pulse, so that a depiction ability of a desired portion of the imaged part is high, when the pulse sequence including the pre-RF pulse is performed. For example, in the case of a suppression RF pulse of saturating magnetization of a predetermined region in advance and suppressing a signal from the predetermined region, shimming of causing the suppression effect to be different partially in the predetermined region is performed by the pre-RF pulse. On the other hand, for the excitation RF pulse, shimming of uniformizing the radiation magnetic field distribution in the entire region is performed.

Hereinafter, embodiments of a shimming method of the MRI apparatus according to the embodiment will be described in conformity to specific imaging methods.

First Embodiment

In the MRI apparatus according to the embodiment, the imaging unit performs the pulse sequence including the application of the excitation RF pulse and the encoding gradient magnetic field and the collection of the NMR signals after application of the pre-RF pulse exciting the first region and images the second region. For example, the pre-RF pulse is a suppression RF pulse suppressing a signal from the first region and the pulse sequence is a pulse sequence based on a time-of-flight (TOF) method.

In the MRI apparatus according to the embodiment, the shimming parameter calculation unit calculates, as the shimming parameter for the pre-RF pulse (first shimming parameter), the shimming parameter in which the radiation magnetic field distribution in a desired part has the minimum value through repeated calculation. The shimming parameter calculation unit also calculates the shimming parameter uniformizing the radiation magnetic field distribution of the entire second region as the shimming parameter for the excitation RF pulse (second shimming parameter).

Hereinafter, mainly the function and an operation of the calculation unit in the MRI apparatus according to the embodiment will be described exemplifying a case in which vascular imaging is performed on a carotid artery which is a target.

Figure 3:
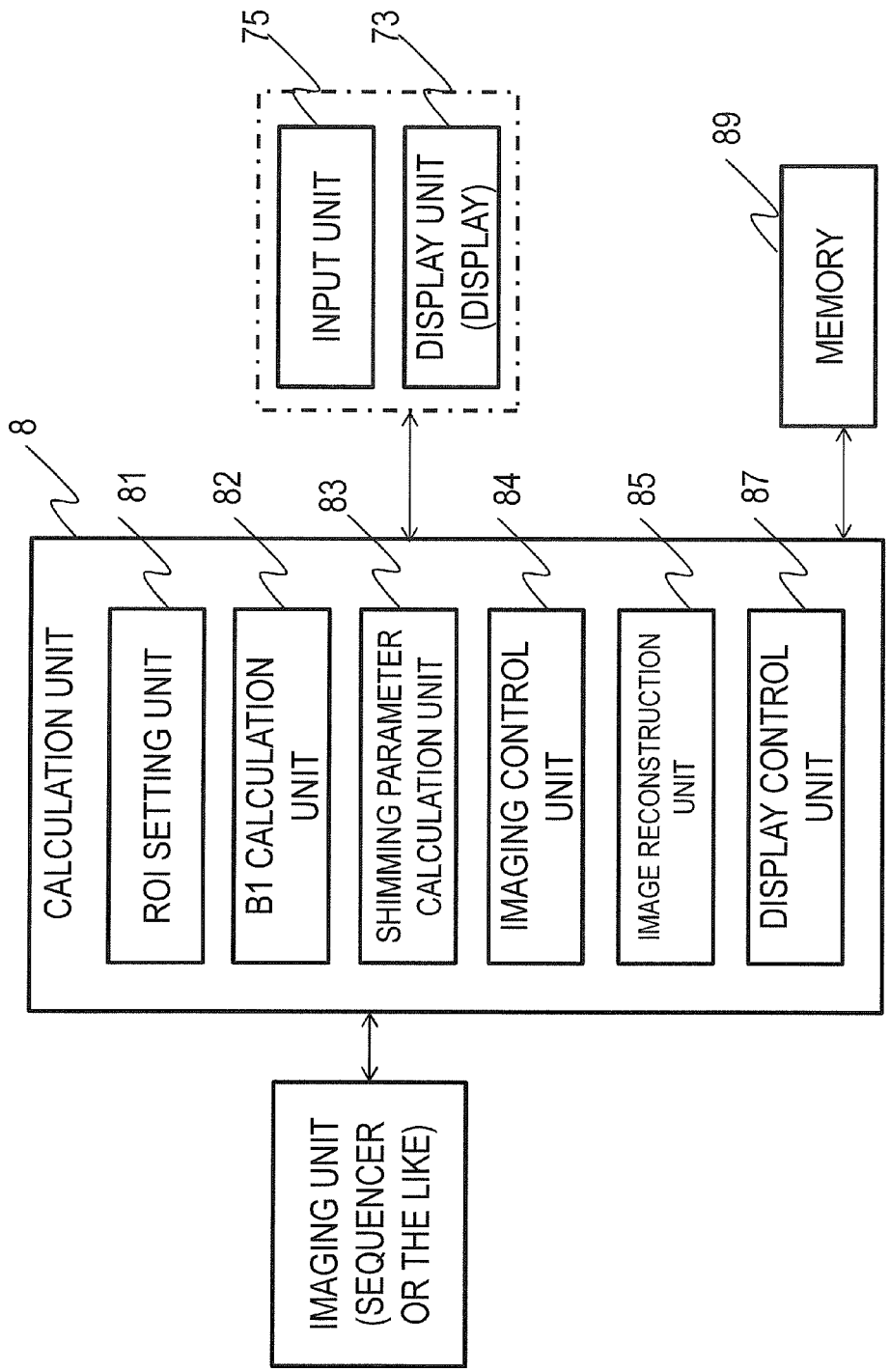
FIG. 3 is a functional block diagram of a calculation unit of the MRI apparatus according to a first embodiment.

As illustrated in the functional block diagram in FIG. 3, the calculation unit 8 according to the embodiment includes an ROI setting unit 81, a radiation magnetic field calculation unit 82, a shimming parameter calculation unit 83, an imaging control unit 84, an image reconstruction unit 85, a display control unit 87, and a memory 89. The calculation unit 8 may have a function of calculating or setting a condition to perform imaging other than the shimming parameters in addition to the units illustrated in FIG. 3.

The ROI setting unit 81 receives information (coordinates) of one ROI or a plurality of ROIs input via the input unit 75. The radiation magnetic field calculation unit (B1 calculation unit) 82 calculates the radiation magnetic field distribution on a predetermined imaged cross section of the object 1 based on the NMR signals. In the illustrated example, the B1 calculation unit 82 is illustrated as one function of the shimming parameter calculation unit 83, but may be independent. The shimming parameter calculation unit 83 calculates the shimming parameters for generating a predetermined radiation magnetic field distribution based on the radiation magnetic field distribution calculated by the B1 calculation unit 82 and the ROI information set by the ROI setting unit 81. Here, the transmission coil 57 is a 4-channel transmission coil, as illustrated in FIG. 2, and is assumed to calculate the shimming parameters of each channel.

The imaging control unit 84 sets the shimming parameters calculated by the shimming parameter calculation unit 83 or the pulse sequence selected via the input unit 75 in the sequencer 4 and controls the imaging unit via the sequencer 4.

The image reconstruction unit 85 reconstructs the image of the object using data received by the reception unit 6 by the imaging. The image of the object includes not only an image of an imaging target part but also a positioning image acquired before the imaging.

The display control unit 87 displays the image generated by the image reconstruction unit 85 as a display image on the display and controls a GUI or the like displayed on the display.

Figure 4:
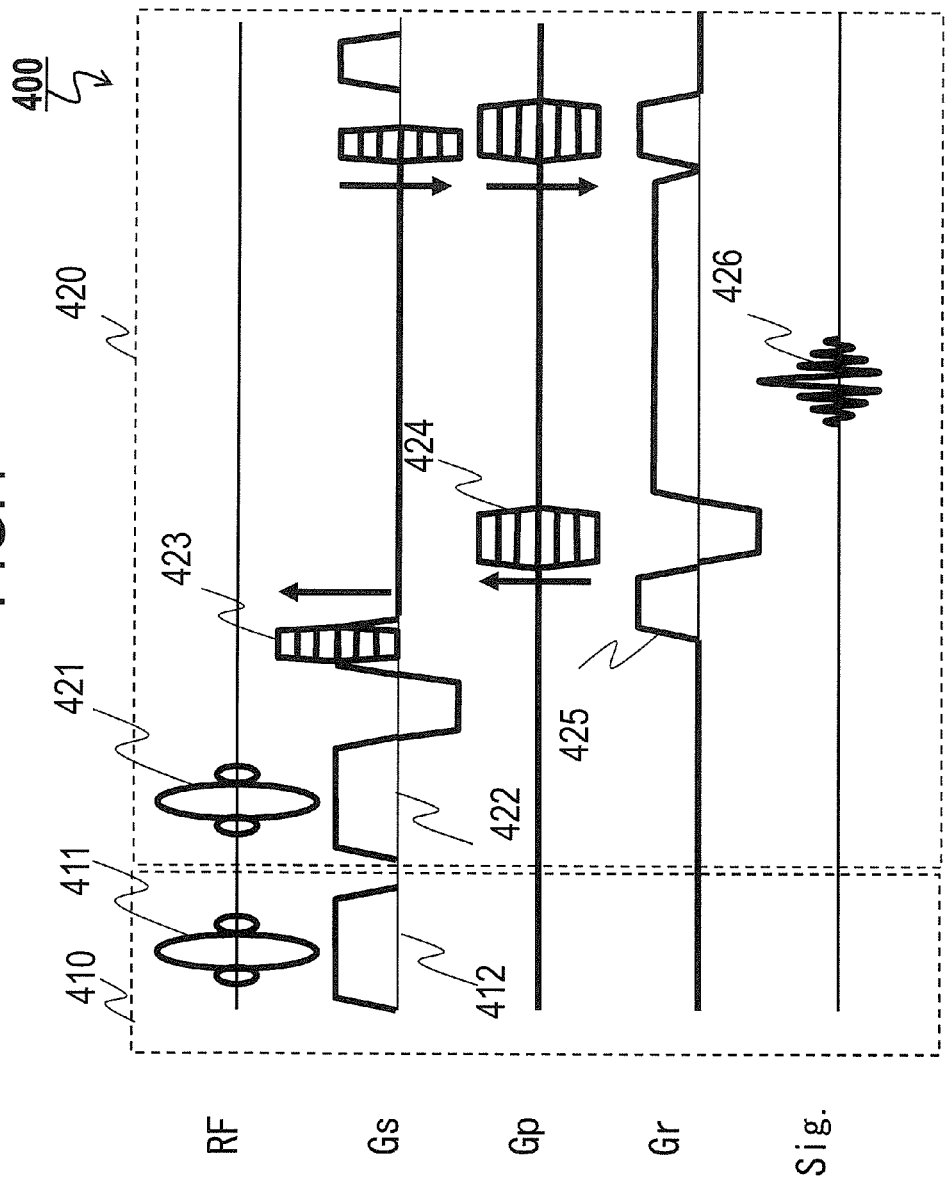
FIG. 4 is a diagram illustrating an example of a pulse sequence adopted in the first embodiment.

Before description of the operation of the calculation unit 8, a pulse sequence used for the vascular imaging by the MRI apparatus according to the embodiment will be described. In FIG. 4, a 3D-TOF sequence 400 is illustrated as an example of a pulse sequence for the vascular imaging. In FIG. 4, RF indicates an application timing of an RF pulse. Gs, Gp, and Gr respectively indicate application timings of a slice selection gradient magnetic field pulse, a phase encoding gradient magnetic field pulse, and a reading gradient magnetic field pulse (frequency encoding gradient magnetic field pulse). Sig indicates generation of an echo signal.

Figure 5:
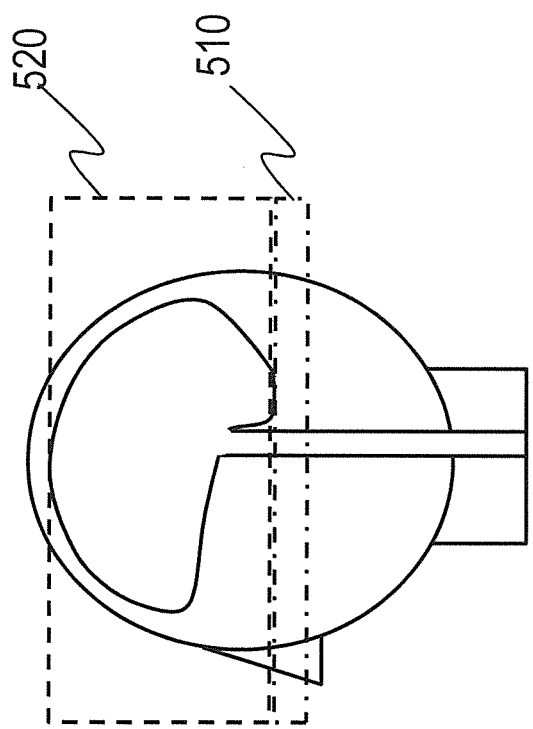
FIG. 5 is a diagram illustrating a relation between first and second regions in an imaging method according to the first embodiment.

The pulse sequence includes a first portion 410 in which a suppression RF pulse 411 is applied and a second portion 420 in which the echo signal is measured after application of an excitation RF pulse 421. In the first portion 410, a slice gradient magnetic field pulse 412 is applied simultaneously with the suppression RF pulse 411. As illustrated in FIG. 5, an object region (first region) 510 in which a carotid artery flows is excited and a blood flow spin in the carotid artery flow is saturated in advance. As will be described below, herein, the first region 510 is not uniformly excited by the suppression RF pulse 411, but an ROI designated in advance and included in the first region 510 is excited so that a suppression effect is weakened.

In the second portion 420 of the pulse sequence, a slice gradient magnetic field pulse 422 selecting a slice plane different from the gradient magnetic field pulse 412 of the first portion 410 is applied simultaneously with the excitation RF pulse 421 to excite an object head 520 (second region) and image a carotid artery flow in the head. An interval between the suppression RF pulse 411 and the excitation RF pulse 421 is set to an appropriate time in consideration of a blood flow rate and a positional relation between imaged parts of the neck and the head.

Acquiring of an echo signal 426 by applying gradient magnetic field pulses 423 and 424 in the slice direction and the phase encoding direction after the application of the excitation RF pulse 421 and the slice gradient magnetic field pulse 422 and applying a reading gradient magnetic field 425 and applying of a gradient magnetic field pulse for re-phase after the acquisition of the signal are the same as a pulse sequence of a normal TOF method. Since the illustrated pulse sequence is a 3D pulse sequence, 3-dimensional data of the object head 520 is obtained by repeating measurement of an echo signal while changing the intensities of the slice encoding gradient magnetic field pulse 423, the phase encoding gradient magnetic field pulse 424, and the gradient magnetic field pulse for re-phase.

In the pulse sequence of the TOF method, blood flow spins are drawn using a blood flow inflow effect by continuously measuring signals at a short repetition interval. Accordingly, when the first portion 410, that is, the suppression RF pulse 411, is not applied, the entire blood flows in the head from the right and left carotid arteries are depicted. In the embodiment, by causing the radiation magnetic field distribution by the suppression RF pulse 411 to be different from the radiation magnetic field distribution by the excitation RF pulse 421, specifically, by adjusting the shimming parameters so that the radiation magnetic field at the time of the radiation of the suppression RF pulse 411 is smaller in one of the right and left carotid arteries than the radiation magnetic field in the other carotid artery, a state in which only the one carotid artery is not suppressed is generated. Accordingly, it is possible to draw only one carotid artery in continuous imaging of the TOF method.

Figure 6:
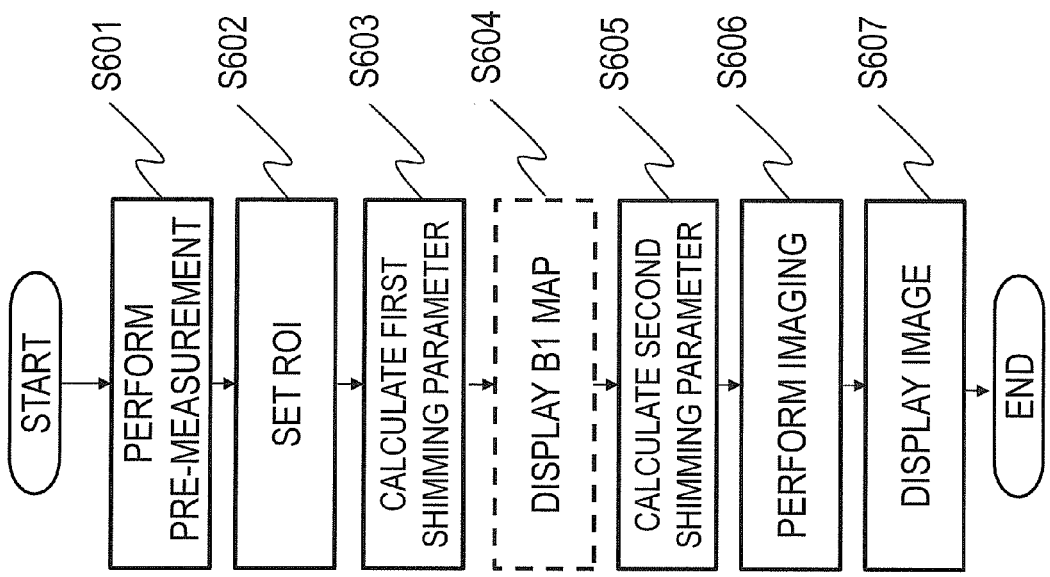
FIG. 6 is a flowchart illustrating an operation of the calculation unit according to the first embodiment.

Next, the operation of the calculation unit 8 will be described focusing on calculation of the shimming parameters in the shimming parameter calculation unit 83. The flow of the operation is illustrated in FIG. 6.

First, before the main scanning, the imaging control unit 84 performs pre-scanning and imaging of a positioning image to acquire a spatial sensitivity distribution of an individual channel of the transmission coil (S601). Based on each spatial sensitivity distribution obtained through the pre-scanning, the parameters (phase and amplitude) of each channel of the transmission coil are set. The parameters in this case may be set by default. The spatial sensitivity distribution is stored in the memory 89. The positioning image is, for example, an image obtained by imaging a wide visual field with a relatively low spatial resolution. An examiner can set a cross section to be imaged or designate a region of interest (ROI) based on the positioning image.

Figure 7:
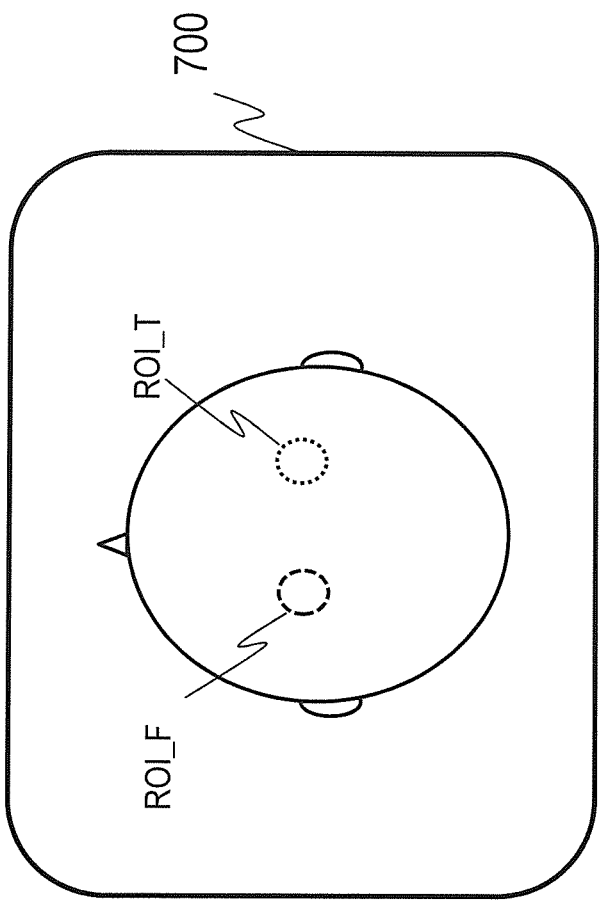
FIG. 7 is a diagram illustrating an input screen example for ROI designation and illustrating a form in which two ROIs on a neck tomographic image are designated according to the first embodiment.

The calculation unit 8 (the display control unit 87) displays the cross section of the first region designated based on the positioning image on the display unit 73 and receives designation of the ROI via the input unit 75 (S602). A screen example of the ROI designation is illustrated in FIG. 7. In the illustrated example, when a tomographic image 700 of a pre-saturation region (first region) is displayed and the examiner designates two right and left carotid arteries drawn in the image using circular marks, positional information of the carotid arteries is delivered to the calculation unit 8 and is set as the ROI in the ROI setting unit 81. Here, an ROI set in a carotid artery in which a signal is suppressed is defined as an "ROI_T" and an ROI set in a carotid artery in which a signal is not suppressed, that is, a carotid artery desired to be drawn, is defined as an "ROI_F."

Instead of the sectional view generated from the positioning image which is an image for ROI setting, a radiation magnetic field distribution B1 obtained from initial values of the parameters (phase and amplitude) of each channel of the transmission coil may be displayed.

Next, the shimming parameter calculation unit 83 calculates the shimming parameter provided for a desired radiation magnetic field distribution using a spatial sensitivity distribution B1n (where a suffix n is an integer of 1 to N and N indicates the number of channels: the same applies below) of each channel of the transmission coil 57 stored in the memory 89 and information regarding the ROI set in the ROI setting unit 81 (S603).

Therefore, the radiation magnetic field calculation unit 82 first calculates a radiation magnetic field distribution (B1 map) B1 of the entire pre-saturation region using the spatial sensitivity distribution B1n of each channel and a phase $\phi n$ and an amplitude An of the individual channel. In general, the radiation magnetic field distribution B1 is expressed in Formula (1).

[Formula 1]

$$B1 = \Sigma A_n \exp(i\phi^n) B1_n \quad (1)$$

Here, the radiation magnetic field distribution B1 calculated in Formula (1) from the initial values of the shimming parameters (An, $\phi n$) is assumed to be an initial value $B1_0$ of the following calculation.

Next, the shimming parameter calculation unit 83 sets an average value of B1 in ROI_F as an evaluation function f (Formula (2) below) when the phase $\phi n$ and the amplitude An of each channel are changed, and calculates a combination of the phase and the amplitude for minimizing the evaluation function, that is, the shimming parameters.

[Formula 2]

$$f = \text{mean}(B1(ROI\_F)) \quad (2)$$

In the calculation of the shimming parameters for minimizing the evaluation function f, for example, a known optimization algorithm such as a steepest descent method can be used. As the initial value of B1 (ROI_F) in the repeated calculation, a distribution in ROI_F can be used among the initial values $B1_0$ of the radiation magnetic field distributions. A condition that the average value of B1 in ROI_T is not changed is set as a constraint condition of the repeated calculation. That is, the average value of B1 in B1 (ROI_T) is maintained to an average B1 $(ROI\_T)_0$ in ROI_T of the initial value $B1_0$, as expressed in Formula (3).

[Formula 3]

$$\text{mean}(B1(ROI\_T)) = B1_0(ROI\_T) \quad (3)$$

In addition to the above-described constraint condition, restriction of a specific absorption rate (SAR) SAR may be added as a constraint condition. When the shimming parameters (An, $\phi n$) set with the initial value are set in consideration of the SAR, a condition that the shimming parameters are equal to the SAR at that time or do not exceed the SAR is set as a constraint condition. The SAR can be calculated when the pulse sequence and a parameter for deciding the pulse sequence are decided. Since a method of calculating the SAR is known, the description thereof will be omitted herein.

The calculation unit 8 may display the radiation magnetic field distribution image obtained by the calculated shimming parameters on the display unit 73 (S604). By displaying the radiation magnetic field distribution image in parallel to an image used in, for example, an ROI setting screen, it is possible to confirm whether a radiation magnetic field distribution in which ROI_T and ROI_F are appropriately subjected to signal suppression or are not subjected to the signal suppression is set. However, displaying of the result on the display unit 73 is not a prerequisite in the embodiment.

A change in the radiation magnetic field distribution of the first region (an excitation region by the suppression RF pulse) at the time of changing of the shimming parameters according to the embodiment is illustrated in FIGS. 8A and 8B. In FIG. 8A-1, ROI_T and ROI_F set in this screen are displayed in an initial B1 map image. FIG. 8B-1 illustrates a B1 map image of the radiation magnetic field calculated using the shimming parameters calculated in step S603. Below both of FIGS. 8A-1 and 8B-1, pixel values (corresponding to magnetic field intensities) on lines (white lines) parallel to the X axis are illustrated by ROI_T and ROI_F (see FIGS. 8A-2 and 8B-2). As understood from this comparison, the magnetic field distribution is initially uniform and there is nearly no difference between ROI_T and ROI_F. However, after the shimming, the magnetic field intensity in ROI_T is larger than that in ROI_F. That is, when the RF pulse is radiated with the radiation magnetic field distribution, the blood flow spins in ROI_T are excited and the signals in the subsequent TOF pulse sequence are suppressed. However, the blood flow spins in ROI_F are imaged with high contrast due to the inflow effect without suppressing of the signals.

The shimming parameter calculation unit 83 sets the calculated shimming parameter as the shimming parameter (first shimming parameter) of the suppression RF pulse 411 of the pulse sequence 400 illustrated in FIG. 4 in the imaging unit (the sequencer 4).

Subsequently, the shimming parameter calculation unit calculates the shimming parameter (second shimming parameter) of an imaging target part (second region) of the TOF method (S605). The shimming parameter of the head is decided so that the uniformity of the radiation magnetic field of the head is the best. The uniformity is calculated using, for example, an evaluation function Usd expressed in Formula (4) and the shimming parameter for minimizing the evaluation function is calculated.

[Formula 4]

$$Usd = \frac{\sigma(B1)}{m(B1)} \quad (4)$$

In the expression, m(B1) and $\sigma$ (B1) are an average value and a standard deviation of B1. That is, Usd is a value obtained by dividing the standard deviation by the average value of B1. As a variation in B1 is smaller, this value is smaller and the uniformity of B1 is high. In the flow of FIG. 6, step S605 is performed after step S603 of calculating the first shimming parameter. However, step S605 may be performed immediately after each spatial sensitivity distribution B1n is obtained through pre-scanning before the imaging.

The shimming parameter calculated in step S605 is set as the shimming parameter (second shimming parameter) of the excitation RF pulse 421 of the pulse sequence 400 in FIG. 4 in the imaging unit (the sequencer 4).

After the shimming parameters of the RF pulses 411 and 421 are set in this way, the imaging control unit 84 starts imaging (S606). That is, the imaging is performed according to the pulse sequence 400 illustrated in FIG. 4 to acquire the image data of the head which is an imaged part. At this time, the suppression RF pulse 411 is radiated with the first shimming parameter and the excitation RF pulse 421 is radiated with the second shimming parameter. The blood flow spins in ROI_T on the imaged cross section excited with the excitation RF pulse 421 flow in the saturated state by the suppression RF pulse 411, and therefore the signals therefrom are suppressed. In contrast, the blood flow spins in ROI_F flow in the imaged cross section without the suppression by the suppression RF pulse 411, and high signals are realized by the inflow effect. That is, it is possible to obtain an image in which only the carotid artery selected as ROI_F is drawn.

Figure 9:
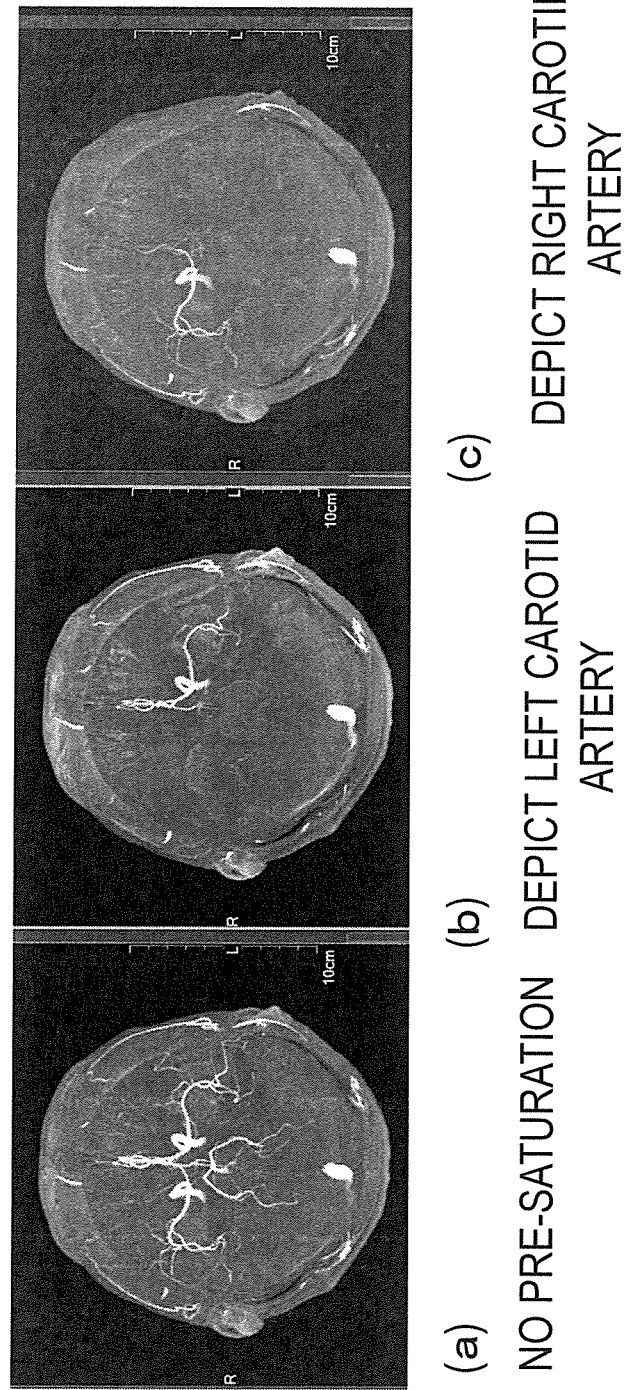
FIG. 9(a) is a diagram illustrating an image example of a head image imaged by an MRI apparatus according to the first embodiment when pre-saturation is not performed.
FIG. 9(b) is a diagram illustrating an image example of a head image in which a signal from a right carotid artery is suppressed.
FIG. 9(c) is a diagram illustrating an image example of a head image in which a signal from a left carotid artery is suppressed.

FIGS. 9(a), 9(b), and 9(c) illustrate examples of images to which the embodiment is applied. FIG. 9(a) illustrates the image obtained by performing imaging of the TOF method by omitting the first portion 410 of the pulse sequence 400 in FIG. 4, that is, without performing the pre-saturation. FIGS. 9(b) and 9(c) illustrate the images obtained by setting ROI_F in each of the left and right carotid arteries and performing the imaging of the pulse sequence in FIG. 4 including the pre-saturation.

When 3D data can be obtained in the 3D pulse sequence, the image reconstruction unit 85 may generate, as the image, not only the tomographic image but also a 3D image using a known scheme such as volume rendering or MIP processing. The display control unit 87 displays the image generated by the image reconstruction unit 85 along with supplementary information regarding the object or the imaging, as necessary, on the display unit 73 (S607).

In the embodiment, as described above, only the desired blood flow can be selectively imaged among the blood flows in the first and second regions by causing the shimming parameter of the suppression RF pulse to be different from the shimming parameter of the excitation RF pulse when the blood flows are imaged using the suppression RF pulse exciting the first region and the excitation RF pulse exciting the second region different from the first region. In this case, since a high frequency pulse for which an application time of an RF pulse as in so-called 2D excitation is long is not used, prolongation of a measurement time can be suppressed and the SAR can also be suppressed to an appropriate range.

The first embodiment has been described exemplifying the case in which the blood flow is imaged in the carotid artery which is a target, but the imaging target is not limited to the carotid artery, and various blood flows can be set as targets. In the foregoing embodiment, the pulse sequence of the 3D-TOF method has been exemplified, but a 2D-TOF method may be used. Further, various known modification examples of the encoding direction or the gradient magnetic field application method can also be adopted. Furthermore, instead of the TOF method, a pulse sequence of a Phase Contrast (PC) method or the like can be adopted as the blood flow imaging sequence subsequent to the pre-saturation.

In the foregoing embodiment, the case in which an input of the examiner is received and the ROI is set has been described. However, depending on a part, the ROI setting unit 81 can also set the ROI by automatically detecting a large carotid artery using information such as a pixel value of a tomographic image or an area of predetermined pixel values. In this case, step S602 of the ROI setting in FIG. 6 is an automatic setting step of the ROI by the ROI setting unit 81.

Modification Example of First Embodiment

In the first embodiment, two ROIs (ROI_T and ROI_F) have been set, the signals from one ROI have been suppressed, and the shimming parameters have been set so that the signals from the other ROI are not suppressed. However, the number of set ROIs is not limited to two. Hereinafter, a case in which three ROIs are set will be described according to a modification example of the first embodiment. The configuration of an apparatus, a pulse sequence to be adopted, and the like are the same as those in the first embodiment. The common elements or steps to the first embodiment will be omitted and differences from the first embodiment will be mainly described. The drawings referred to in the first embodiment are cited, as necessary.

Figure 10:
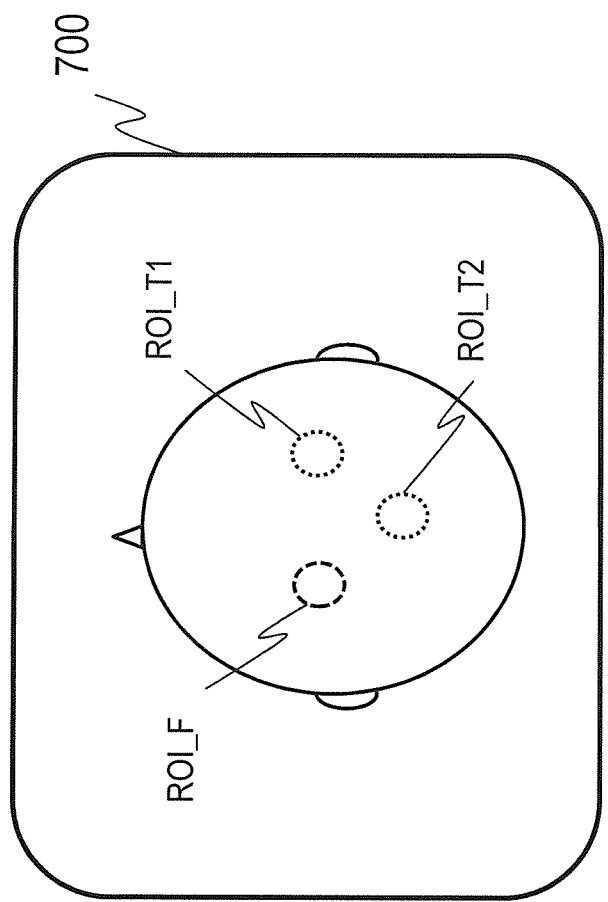
FIG. 10 is a diagram illustrating ROI setting according to a modification example of the first embodiment.

FIG. 10 illustrates an example of an ROI setting screen in which the cross section of the first region is displayed. As illustrated, as arteries flowing in the head, there is a vertebral artery in addition to two carotid arteries described in the first embodiment. In the embodiment, signals from any two arteries among two carotid arteries and the vertebral artery are suppressed and only one artery is drawn. Therefore, the ROI setting unit 81 sets two ROI_T1 and ROI_T2 suppressing the signals in the blood flow depiction (the second portion 420 of the pulse sequence in FIG. 4) and one ROI_F suppressing no signal. For example, the setting is performed such that the signals from one of the right and left carotid arteries and the vertebral artery are suppressed and the signal from the other carotid artery is not suppressed. As illustrated in FIG. 10, the setting of the ROI can be performed as in the first embodiment by displaying the tomographic image of the region (the first region) in which the signal is suppressed by the suppression RF pulse and receiving designation of the ROI by the examiner. Further, the setting may be performed automatically.

Next, the shimming parameter calculation unit 83 calculates shimming parameters for minimizing the evaluation function expressed in Formula (2) described above through repeated calculation using the positional information of the three ROIs set by the ROI setting unit 81 and the transmission sensitivity distribution B1n of each channel of the transmission coil obtained through pre-scanning.

Here, in the repeated calculation, as expressed in the following formulae, a condition that none of the average values of the radiation magnetic field distributions of the first region are changed in two ROI_T1 and ROI_T2 is set as a constraint condition. Even in this case, the constraint condition such as the SAR may be added.

[Formula 5]

$$\text{mean}(B1(ROI\_T1)) = B1_0(ROI\_T1) \tag{5-1}$$

$$\text{mean}(B1(ROI\_T2)) = B1_0(ROI\_T2) \tag{5-2}$$

The shimming parameters calculated in this way are set in the imaging unit, the pulse sequence illustrated in FIG. 4 is performed, and the second region is imaged in the same way as that of the first embodiment.

According to the modification example, the signal from the vertebral artery is also suppressed in the imaging of the arteries of the head. Therefore, it is possible to improve the depiction ability when the right and left carotid arteries are separately imaged. When the vertebral artery is set as the part (ROI_F) in which the signal is not suppressed, only the vertebral artery can be imaged. The modification example is not limited to the imaging of the carotid arteries either, but can be applied when only one artery is imaged in an abdomen and other parts in which a plurality of larger arteries flow.

Second Embodiment

In an embodiment, a plurality of shimming parameters for a suppression RF pulse are calculated and a plurality of imagings are performed with different shimming parameters, so that an image of a targeting part can be obtained through calculation between the images obtained through the plurality of imagings.

That is, in an MRI apparatus according to the embodiment, a shimming parameter calculation unit calculates not only a first shimming parameter but also a third shimming parameter different from the first shimming parameter as shimming parameters for a pre-RF pulse. An imaging unit performs first imaging using the pre-RF pulse adjusted with the first shimming parameter and an excitation RF pulse, second imaging using the pre-RF pulse adjusted with the third shimming parameter and the excitation RF pulse, and third imaging using the excitation RF pulse without using the pre-RF pulse and forms an image of an object using NMR signals obtained through the first imaging, the second imaging, and the third imaging.

In the embodiment, the configuration of the calculation unit is common to the configuration of the first embodiment illustrated in FIG. 3. Different functions of the calculation unit and the imaging unit from the first embodiment will be mainly described appropriately citing FIG. 3.

Figure 11:
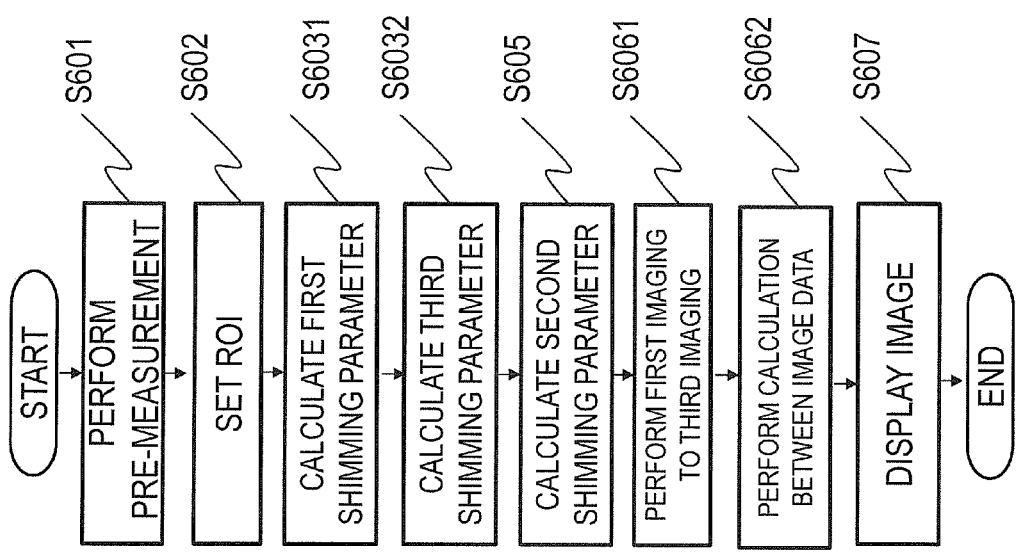
FIG. 11 is a flowchart illustrating an operation of a calculation unit according to a second embodiment.

An operation order of the imaging unit and the calculation unit of the MRI apparatus according to the embodiment is illustrated in FIG. 11. In FIG. 11, the same reference numerals are given to the same steps as those in FIG. 6 and the description thereof will be omitted.

In ROI setting step S602 subsequent to the pre-measurement (S601), three ROIs are set in, for example, two carotid arteries and a vertebral artery, as in the second embodiment. These ROIs are assumed to be ROI_A (left carotid artery), ROI_B (right carotid artery), and ROI_C (vertebral artery). Subsequently, the shimming parameter calculation unit 83 calculates two shimming parameters (the first and third shimming parameters) as the shimming parameters of the suppression RF pulse (S6031 and S6032). The first shimming parameter is decided, for example, so that the radiation magnetic field distribution is minimized in ROI_A. In the two other ROI_B and ROI_C, a condition that an average value of the radiation magnetic field distributions is not changed is set as a constraint condition. The third shimming parameter is decided, for example, so that the radiation magnetic field distribution is minimized in ROI_B. In the two other ROI_A and ROI_C, a condition that an average value of the radiation magnetic field distributions is not changed is set as a constraint condition. The shimming parameter (the second shimming parameter) is also set in the second region which is an imaged part (S605). This shimming parameter may be an initial value set at the time of pre-scanning and is a shimming parameter decided so that the radiation magnetic field distribution of the second region is uniform.

Although omitted in FIG. 11, as in step S604 of the first embodiment, the magnetic field distribution (B1 map) generated by radiating the RF pulse at the time of using the shimming parameters may be calculated to be displayed.

Next, the imaging unit sequentially performs three types of imaging (S6061). Any order of the imaging can be used. In the first imaging, the suppression RF pulse adjusted with the first shimming parameter is radiated in the pulse sequence 400 illustrated in FIG. 4. In the subsequent pulse sequence, the signal other than ROI_A (left carotid artery) is suppressed, so that an image obtained by drawing the left carotid artery with high luminance can be obtained. In the second imaging, the suppression RF pulse adjusted with the third shimming parameter is radiated, so that an image in which the signal other than ROI_B (right carotid artery) is suppressed can be obtained. In the third imaging, the pre-saturation is not performed. That is, the TOF method pulse sequence is performed without performing the suppression RF pulse application portion 410 of the pulse sequence 400 illustrated in FIG. 4. Accordingly, it is possible to obtain an image in which none of the signals from the arteries are suppressed and which is drawn with high luminance by the inflow effect.

A table indicating a relation between the signal suppression in the first imaging to the third imaging and the obtained images is illustrated in FIG. 12. As illustrated, it is possible to obtain an image of the left carotid artery, an image of the right carotid artery, and an image of three arteries through the three types of imaging. The image reconstruction unit 85 obtains a desired image through calculation of the images obtained by the three types of imaging. For example, an image of the vertebral artery can be obtained by subtracting image data obtained through the first imaging and the second imaging from image data obtained through the third imaging. Additionally, an image in which any two arteries are drawn can be obtained and can be displayed on the display unit in a form in which it is easy to comprehend a relation or the like of the arteries.

When the images of three arteries are obtained separately, the radiation magnetic field distributions in which the arteries are not suppressed can be calculated at the time of radiation of the suppression RF pulse and the three types of imaging can be performed, as described in the modification example of the first embodiment. However, according to the embodiment, the radiation magnetic field distribution may be calculated by two types of imaging and the radiation magnetic field distribution calculation process can be reduced.

Third Embodiment

In an embodiment, a pulse sequence based on an arterial spin labeling perfusion imaging (ASL) method is set as a target. The pre-RF pulse is a pre-RF pulse labeling blood flow spins flowing in the first region. The second region in which the blood flow spins labeled by the pre-RF pulse flow is imaged.

Figure 13:
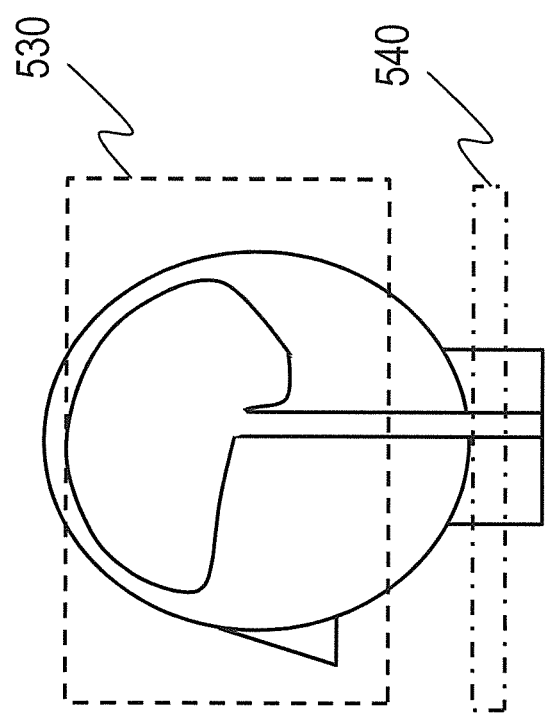
FIG. 13 is a diagram illustrating a relation between first and second regions in an imaging method according to a third embodiment.

The ASL method is a scheme of drawing a perfusion by performing a pulse sequence of signal measurement by labeling the blood flow spins and a pulse sequence of signal measurement without labeling the blood flow spins as a control and subtracting images obtained by the two pulse sequences. In the labeling process, the pre-RF pulse is radiated to a part located in an upstream portion of a blood flow of apart intended to be imaged to reverse the blood flow spins of the part. In the control process, the pre-RF pulse (control RF pulse) not reversing the blood flow spins, that is, setting 0 degrees in magnetization of the part, is applied to the same part as the labeling process. For example, as illustrated in FIG. 13, when an imaged part is a head 530, the blood flow spins of a neck 540 are subjected to the labeling process/control process. Through the labeling process/control process, the target imaged part 530 is selected after a predetermined time and a blood flow imaging pulse sequence is performed to obtain image data.

As the pre-RF pulse used in the labeling process and the control process, for example, a pulse train of a 90-degree pulse: a 180-degree pulse: a 90-degree pulse for labeling and a pulse train of a 90-degree pulse: a 180-degree pulse: a negative 90-degree pulse for control are known. The embodiment is not particularly limited and a known pre-RF pulse is used.

Figure 14:
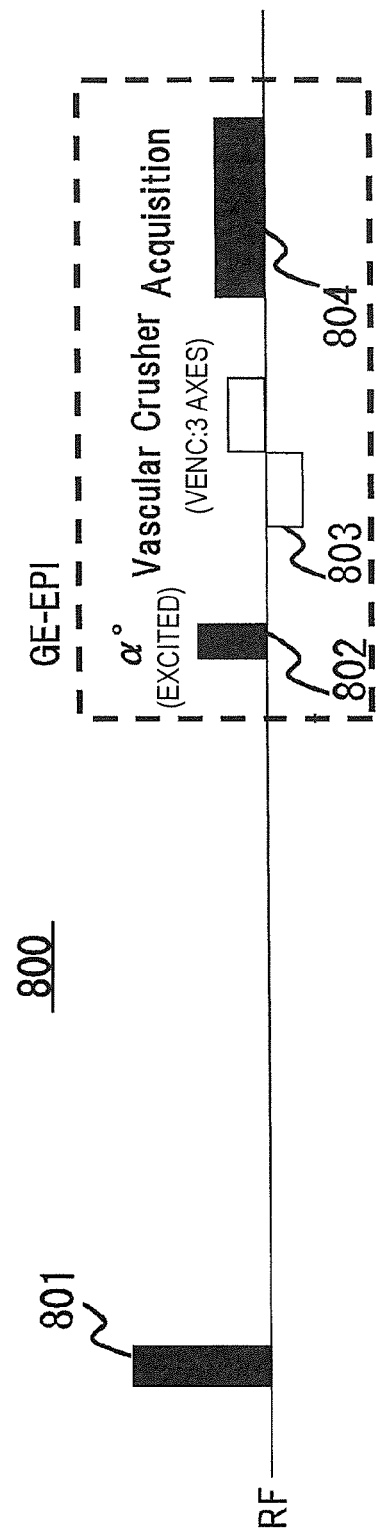
FIG. 14 is a diagram illustrating an example of a pulse sequence adopted in the third embodiment.

A pulse sequence according to a PC method using a flow encoding pulse (VENC) after application of the excitation RF pulse can be used as the blood flow imaging pulse sequence. A GrE-EPI (gradient echo planar method), an FSE (fast spin echo method), or the like is used to collect echo signals. FIG. 14 illustrates an example of a pulse sequence 800 of the ASL method. To facilitate description herein, only application timings of RF pulses 801 and 802 and a VENC 803 and signal acquisition 804 are illustrated. A gradient magnetic field or an encoding gradient magnetic field for slice selection is omitted. A labeling pulse sequence and a control pulse sequence are collectively illustrated. In the pulse sequence, as illustrated, after a part (for example, the neck 540) located on the upstream side of the blood flow of the imaged part is selected and the pre-RF pulse 801 for labeling or control is applied, the excitation RF pulse 802 exciting the imaged part 530 is applied at intervals of a predetermined time. After the excitation RF pulse 802 is applied, the VENC pulse 803 is applied and an echo signal is acquired when a predetermined encoding gradient magnetic field is given.

Here, for the pre-RF pulse 801 and the excitation RF 802, the shimming parameters are independently set. First, for the pre-RF pulse 801, the shimming parameters are set so that the radiation magnetic field distribution is small in a blood vessel other than a blood vessel intended to be drawn in the blood flow in the first region 540. That is, in a region excited with the pre-RF pulse 801, based on two ROI_T and ROI_F set in advance, the shimming parameters are calculated so that the average value of the radiation magnetic field distribution is not changed in one (ROI_T) and the average value of the radiation magnetic field distribution is minimized in the other (ROI_F). For the labeling RF pulse and the control RF pulse, the same shimming parameters are assumed to be set. For the excitation RF pulse 802, the shimming parameters are calculated so that the uniformity of the radiation magnetic field of the entire imaged part is optimized (the uniformity is the highest). The shimming parameter calculation method is the same as the method described in the first embodiment. When the shimming parameters are calculated, the plurality of ROIs are set in the first region, the calculated shimming parameters are set by the imaging unit, and the pulse sequence is performed in the same way as that of the first embodiment.

When the shimming parameters are set in this way, the blood flow spins flowing in the blood vessel (ROI_F) in which the radiation magnetic field distribution is small flow in the imaged part without labeling (reversing) by the labeling pre-RF pulse, and therefore there is nearly no difference between the image obtained after the labeling process and the image obtained after the control process. Therefore, it is possible to obtain the effect in which the arteries are not depicted in the ASL, that is, the same effect as the signal suppression effect. On the other hand, the blood flow spins of the part (blood vessel) (ROI_T) maintaining a relatively large radiation magnetic field are labeled in the labeling process and the magnetization becomes zero in the control process, and therefore the blood flow spins are imaged through difference processing. That is, by decreasing the radiation magnetic field distribution of the labeling pre-RF pulse in a predetermined part, it is possible to selectively depict a part in which the radiation magnetic field is large (the average value of the radiation magnetic field distributions is maintained).

In the embodiment, as in the modification example of the first embodiment, three or more ROIs can be set. As in the second embodiment, a plurality of images for which a part in which the shimming parameter of the pre-RF pulse is changed for suppression is different can be acquired and an image of a desired part can also be obtained through calculation between the images. For example, the first imaging is performed with the shimming parameters optimizing the uniformity of both of the radiation magnetic field distribution of the pre-RF pulse for the labeling/control and the radiation magnetic field distribution of the excitation RF pulse of the blood flow imaging sequence. The second imaging is performed with the shimming parameters suppressing a predetermined blood vessel as the radiation magnetic field distribution of the pre-RF pulse for the labeling/control. By subtracting the image obtained through the second imaging from the image obtained through the first imaging, it is possible to obtain the image in which the predetermined blood vessel is selectively depicted.

According to the embodiment, a target is narrowed in a desired blood flow and a perfusion state can be depicted in perfusion imaging according to the ASL method.

Each embodiment of the MRI apparatus according to the invention has been described. However, the pulse sequence or the imaged part exemplified in each embodiment is merely an example and the invention is not limited thereto. The invention can be applied as long as the imaging method is an imaging method in which two RF pulses exciting different regions are included.

INDUSTRIAL APPLICABILITY

According to the invention, a scheme of selectively drawing a desired part is supplied with a different scheme from selection excitation.

REFERENCE SIGNS LIST

1 OBJECT
2 STATIC MAGNETIC FIELD GENERATION UNIT
3 GRADIENT MAGNETIC FIELD GENERATION UNIT (IMAGING UNIT)
4 SEQUENCER
5 TRANSMISSION UNIT (IMAGING UNIT)
57 HIGH FREQUENCY COIL
6 RECEPTION UNIT (IMAGING UNIT)
7 SIGNAL PROCESSING UNIT
73 DISPLAY UNIT (DISPLAY)
75 INPUT UNIT
8 CALCULATION UNIT
81 ROI SETTING UNIT
82 RADIATION MAGNETIC FIELD CALCULATION UNIT
83 SHIMMING PARAMETER CALCULATION UNIT
84 IMAGING CONTROL UNIT
85 IMAGE RECONSTRUCTION UNIT
87 DISPLAY CONTROL UNIT
89 MEMORY
411 SUPPRESSION RF PULSE (PRE-RF PULSE)
421 EXCITATION RF PULSE
400 TOF PULSE SEQUENCE
510 FIRST REGION
520 SECOND REGION
800 ASL SEQUENCE
801 RF PULSE FOR LABELING (PRE-RF PULSE)
802 EXCITATION RF PULSE

What is claimed is:
1. A magnetic resonance imaging apparatus comprising:
an imaging unit configured to include a transmission coil of a plurality of channels radiating high frequency pulses from the plurality of channels and collect NMR signals using the high frequency pulses which include a preliminary RF pulse exciting a first region of an object and an excitation RF pulse exciting a second region different from the first region; and a shimming parameter calculation unit configured to calculate shimming parameters for adjusting radiation magnetic field distributions generated by the high frequency pulses radiated from the plurality of channels, wherein the shimming parameter calculation unit calculates, as the shimming parameter for the preliminary RF pulse, a first shimming parameter different from a second shimming parameter which is a shimming parameter set for the excitation RF pulse so that the radiation magnetic field distribution generated in the first region by the preliminary RF pulse is smaller in a radiation magnetic field of a first part than in a radiation magnetic field of a second part, by repeatedly performing calculation under a constraint condition that an average value of the radiation magnetic field distribution in the second part is not changed, and wherein the imaging unit performs imaging using the preliminary RF pulse adjusted with the first shimming parameter and the excitation RF pulse adjusted with the second shimming parameter.

2. The magnetic resonance imaging apparatus according to claim 1, wherein the shimming parameter calculation unit calculates the first shimming parameter by repeatedly performing the calculation under a constraint condition that a specific absorption rate at a time of radiation of the preliminary RF pulse with the first shimming parameter does not exceed a specific absorption rate at a time of optimization of uniformity of the radiation magnetic field distribution generated in the first region.

3. The magnetic resonance imaging apparatus according to claim 1, further comprising:

an input unit configured to receive designation of a part in the first region, wherein the shimming parameter calculation unit calculates the first shimming parameter in regard to the part designated via the input unit.

4. The magnetic resonance imaging apparatus according to claim 3, wherein the input unit includes a display unit displaying an object image including the first region and a GUI for designating the part on the object image.

5. The magnetic resonance imaging apparatus according to claim 4, wherein the object image is a morphological image or a radiation magnetic field distribution image obtained by imaging the object which is an imaging target.

6. The magnetic resonance imaging apparatus according to claim 1, wherein the shimming parameter calculation unit calculates a shimming parameter for uniformizing a radiation magnetic field distribution of the entire second region as the second shimming parameter.

7. The magnetic resonance imaging apparatus according to claim 1, wherein the shimming parameter calculation unit calculates a third shimming parameter different from the first shimming parameter as the shimming parameter for the preliminary RF pulse, and wherein the imaging unit performs first imaging using the preliminary RF pulse adjusted with the first shimming parameter and the excitation RF pulse, second imaging using the preliminary RF pulse adjusted with the third shimming parameter and the excitation RF pulse, and third imaging using the excitation RF pulse without using the preliminary RF pulse and forms an image of the object using NMR signals obtained through the first imaging, the second imaging, and the third imaging.

8. The magnetic resonance imaging apparatus according to claim 7, wherein the first shimming parameter calculated by the shimming parameter calculation unit is a shimming parameter in which the radiation magnetic field distribution generated in the first region by the preliminary RF pulse is small in a first part of the first region, and the third shimming parameter is a shimming parameter in which the radiation magnetic field distribution generated in the first region by the preliminary RF pulse is small in a second part different from the first part.

9. The magnetic resonance imaging apparatus according to claim 1, wherein the imaging unit images the second region by performing a pulse sequence including application of the excitation RF pulse and an encoding gradient magnetic field and the collection of the NMR signals after application of the preliminary RF pulse.

10. The magnetic resonance imaging apparatus according to claim 9, wherein the preliminary pulse is a suppression RF pulse suppressing a signal from the first region and the pulse sequence is a pulse sequence based on a time-of-flight (TOF) method.

11. The magnetic resonance imaging apparatus according to claim 9, wherein the preliminary pulse is a preliminary RF pulse labeling a fluid spin flowing in the first region and the pulse sequence is a pulse sequence based on an arterial spin labeling perfusion imaging (ASL) method.

12. The magnetic resonance imaging apparatus according to claim 1, wherein the number of channels of the transmission coil is equal to or greater than 4.

13. A magnetic resonance imaging apparatus comprising:

an imaging unit configured to include a transmission coil of a plurality of channels radiating high frequency pulses from the plurality of channels and collect NMR signals using the high frequency pulses which include a preliminary RF pulse exciting a first region of an object and an excitation RF pulse exciting a second region different from the first region; and a shimming parameter calculation unit configured to calculate shimming parameters for adjusting radiation magnetic field distributions generated by the high frequency pulses radiated from the plurality of channels, wherein the shimming parameter calculation unit calculates, as the shimming parameter for the preliminary RF pulse, a first shimming parameter different from a second shimming parameter which is a shimming parameter set for the excitation RF pulse so that the radiation magnetic field distribution generated in the first region by the preliminary RF pulse is smaller in a radiation magnetic field of a first part than in a radiation magnetic field of a second part, by repeatedly performing the calculation under a constraint condition that a specific absorption rate at a time of radiation of the preliminary RF pulse with the first shimming parameter does not exceed a specific absorption rate at a time of optimization of uniformity of the radiation magnetic field distribution generated in the first region.

* * * * *